(12) United States Patent
Arita et al.

(10) Patent No.: US 8,748,003 B2
(45) Date of Patent: Jun. 10, 2014

(54) GAS BARRIER LAMINATE AND PRODUCTION METHOD OF THE SAME

(75) Inventors: Hiroaki Arita, Tokyo (JP); Toshio Tsuji, Tokyo (JP); Chikao Mamiya, Tokyo (JP); Kazuhiro Fukuda, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 558 days.

(21) Appl. No.: 11/574,048

(22) PCT Filed: Aug. 30, 2005

(86) PCT No.: PCT/JP2005/015710
§ 371 (c)(1),
(2), (4) Date: Feb. 21, 2007

(87) PCT Pub. No.: WO2006/025356
PCT Pub. Date: Mar. 9, 2006

(65) Prior Publication Data
US 2009/0053526 A1    Feb. 26, 2009

(30) Foreign Application Priority Data
Sep. 1, 2004 (JP) ................................. 2004-254022

(51) Int. Cl.
*B32B 27/00* (2006.01)

(52) U.S. Cl.
USPC ...... 428/451; 427/255.6; 427/569; 428/411.1

(58) Field of Classification Search
USPC ..................... 427/255.6, 569; 428/411.1, 451
See application file for complete search history.

(56) References Cited

U.S. PATENT DOCUMENTS

| | | | | |
|---|---|---|---|---|
| 5,736,207 | A | * | 4/1998 | Walther et al. ............... 428/34.7 |
| 2003/0189403 | A1 | * | 10/2003 | Yamada et al. ............... 313/511 |
| 2003/0215652 | A1 | | 11/2003 | O'Connor |
| 2004/0253451 | A1 | | 12/2004 | Kawashima |

FOREIGN PATENT DOCUMENTS

| | | |
|---|---|---|
| DE | 198-08-180 | 9/1999 |
| DE | 102-58-678 | 7/2004 |
| EP | 1-351-321 | 10/2003 |
| JP | 5312953 | 2/1978 |
| JP | 58217344 | 12/1983 |
| JP | 1234566 | 9/1989 |
| JP | 5194770 | 8/1993 |
| JP | 10249990 | 9/1998 |
| JP | 11129382 | 5/1999 |
| JP | 11513713 | 11/1999 |
| JP | 2000-192246 | 7/2000 |

(Continued)

OTHER PUBLICATIONS

Supplemental Partial European Search Report EP 05 78 1275 dated Feb. 10, 2011 (10 pages).

(Continued)

*Primary Examiner* — D. S. Nakarani
(74) *Attorney, Agent, or Firm* — Lucas & Mercanti, LLP

(57) ABSTRACT

A gas barrier laminate comprising a substrate having thereon at least a gas barrier layer and a polymer layer, wherein at least one polymer layer is provided adjacent to at least one gas barrier layer; and an average carbon content of the polymer layer at a contact interface between the gas barrier layer is lower than an average carbon content in the polymer layer.

8 Claims, 4 Drawing Sheets

(56) References Cited

FOREIGN PATENT DOCUMENTS

| | | |
|---|---|---|
| JP | 2003-257619 | 9/2003 |
| JP | 2003340971 | 12/2003 |
| JP | 20049395 | 1/2004 |
| JP | 2004124203 | 4/2004 |
| JP | 2005206646 | 8/2005 |
| WO | 00/26973 | 5/2000 |
| WO | 0026973 | 5/2000 |

OTHER PUBLICATIONS

Japanese Office Action, Notice of Reasons for Refusal, Patent Application No.: 2012-233040, date of drafting: Dec. 25, 2013 (3 pages).
English translation of Japanese Office Action, Notice of Reasons for Refusal, Patent Application No. 2012-233040, date of drafting: Dec. 25, 2013 (4 pages).

* cited by examiner

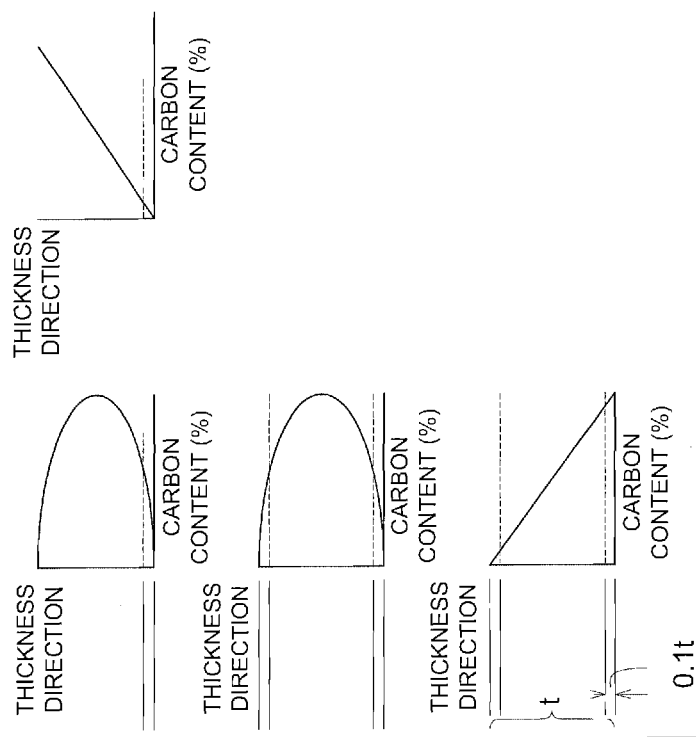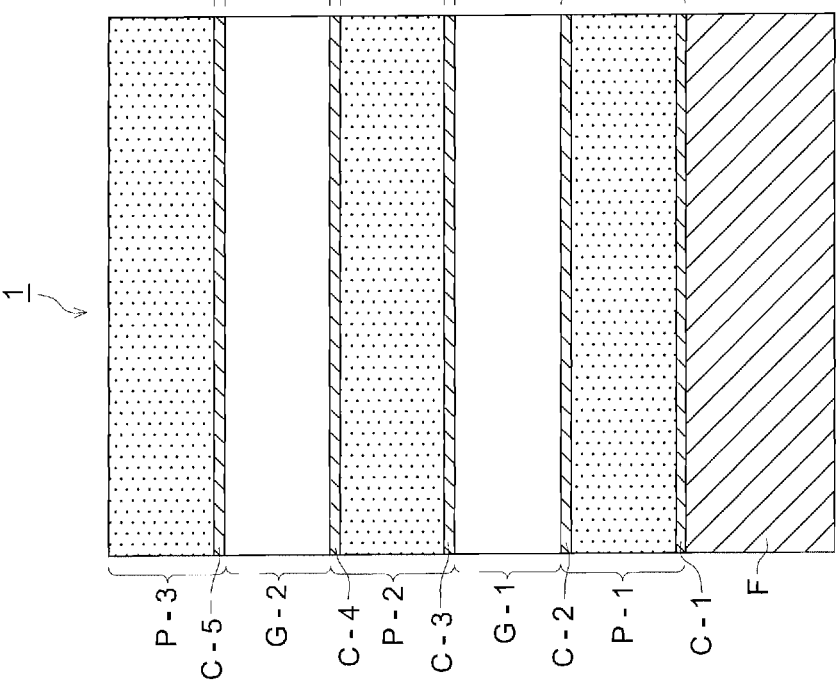

US 8,748,003 B2

GAS BARRIER LAMINATE AND PRODUCTION METHOD OF THE SAME

FIELD OF THE INVENTION

The present invention relates to a gas barrier laminate and a production method of the same.

BACKGROUND OF THE INVENTION

Hitherto, a gas barrier film composed of a resin substrate on which a thin layer of metal oxide is formed is widely used for packaging a product requiring to be insulated from gas such as moisture and oxygen or packaging for preventing deterioration of foods, industrial products and medicines.

Moreover, such the barrier material is used for liquid crystal displaying elements, solar cells and electroluminescence (EL) substrate other than the packaging material. Recently, the transparent substrate which is progressively applied to the liquid crystal elements and the organic EL elements is required to be light weight and large size and further required higher requirements such as long durability, high freeness in form and ability for displaying on curved face. Therefore, the use of film materials such as transparent plastics begins as the transparent substrate in stead of a glass substrate which is heavy, easily broken and difficulty made in a form of large area plate.

However, there is a problem such as that the transparent plastic film substrate is inferior to glass in the ability of gas barrier. When a material inferior in the gas barrier ability is used, moisture or air penetrates so as to deteriorate the liquid crystals in the liquid crystal cell and cause displaying defects and lowering in the displaying quality.

It has been known for solving such the problem to use a gas barrier film material which is prepared by forming a thin layer of metal oxide on a film substrate. As the gas barrier film to be used for the packaging material and the liquid crystal display, a plastic film is known, on which silicon oxide (Patent Document 1) or aluminum oxide (Patent Document 2) is vapor deposited. Both of them have a moisture barrier ability of about 1 g/m²/day.

Recently, the requirement to the gas barrier ability of the film substrate is raised to a level of about 0.1 g/m²/day accompanied with the development of organic EL, large size liquid crystal display and high definition display.

Furthermore, the development of the organic EL display and the high definition color display is rapidly progressed. Consequently, a multilayered material is recently desired, which has higher gas barrier ability, particularly less than 0.1 g/m²/day, while maintaining transparency capable of applying in such the field.

Corresponding to the above requirements, thin layer forming methods for producing a barrier resin substrate having a structure composed of alternatively piled polymer layers and gas barrier layers, for example, cf. Patent Documents 3 and 4. However, the thin layer forming methods proposed there have problems regarding the adhesiveness between the substrate and the polymer layer or the polymer layer and the gas barrier layer, flexibility and resistivity to environment on the occasion of storage under severe conditions for long time since the layer is constituted by alternatively pilling the polymer layer and the gas barrier layer each having uniform composition. Therefore, a rapid improvement is desired.

| Patent Document 1 Publication No. 53-12953 | Examined Japanese Patent |
| Patent Document 2 Open to Public Inspection (hereafter referred to as JP-A) No. 58-217344 | Japanese Patent Publication |
| Patent Document 3 | WO 00/026973 |
| Patent Document 4 | JP-A No. 2004-9395 |

SUMMARY OF THE INVENTION

An object of the present invention is to provide a gas barrier laminate exhibiting a high gas barrier ability, an improved adhesiveness between the substrate and the polymer layer, an excellent bending resistivity and an excellent environmental resistance, and to provide a production method of the same.

One of the aspects to achieve the above object of the present invention is a gas barrier laminate comprising a substrate having thereon at least a gas barrier layer and a polymer layer, wherein at least one polymer layer is provided adjacent to at least one gas barrier layer; and an average carbon content of the polymer layer at a contact interface between the gas barrier layer is lower than an average carbon content in the polymer layer.

BRIEF DESCRIPTION OF THE DRAWINGS

FIG. 1 is a schematic illustration showing examples of a constitution of the gas barrier laminate and patterns of carbon content variation.

DESCRIPTION OF THE PREFERRED EMBODIMENTS

Figure 2:
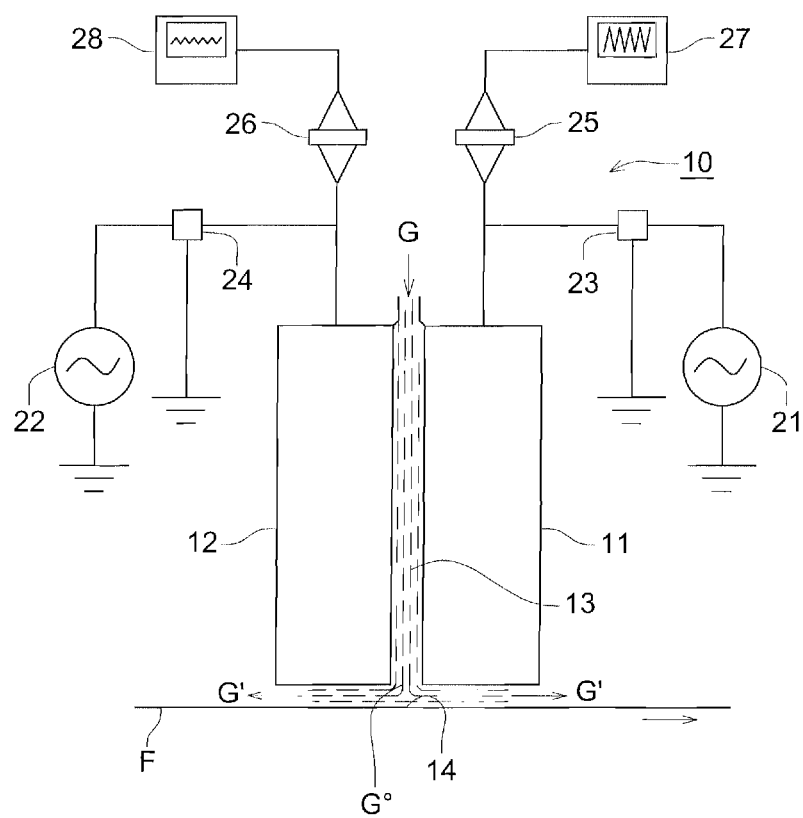
FIG. 2 is a schematic illustration of a jet type atmospheric pressure plasma discharge apparatus useful for the present invention.

The above object of the present invention is achieved by the following structures.

(1) A gas barrier laminate comprising a substrate having thereon at least a gas barrier layer and a polymer layer, wherein
at least one polymer layer is provided adjacent to at least one gas barrier layer; and
an average carbon content of the polymer layer at a contact interface between the gas barrier layer is lower than an average carbon content in the polymer layer.

(2) A gas barrier laminate comprising a substrate having thereon at least a gas barrier layer and a polymer layer, wherein
at least one polymer layer is provided adjacent to the substrate; and an average carbon content of the polymer layer at a contact interface between the substrate is higher than an average carbon content in the polymer layer other than the contact interface.
(3) A gas barrier laminate comprising a substrate having thereon at least a gas barrier layer and a polymer layer, wherein
at least one polymer layer is provided adjacent to at least one gas barrier layer;
an average carbon content of the polymer layer at a contact interface between the gas barrier layer is lower than an average carbon content in the polymer layer provided adjacent to the gas barrier layer;
at least one polymer layer is provided adjacent to the substrate; and
an average carbon content of the polymer layer at a contact interface between the substrate is higher than an average carbon content in the polymer layer provided adjacent to the substrate other than the contact interface.
(4) The gas barrier laminate of any one of Items (1) to (3), wherein the gas barrier layer and the polymer layer are alternatively laminated.
(5) The gas barrier laminate of Item (1), (3) or (4), wherein a carbon content in the polymer layer provided adjacent to the gas barrier layer continuously changes along a thickness direction.
(6) The gas barrier laminate of Item (2) or (3), wherein a carbon content in the polymer layer provided adjacent to the substrate continuously changes along a thickness direction.
(7) A method of producing the gas barrier laminate of any one of Items (1) to (6) comprising the steps of:
forming a polymer layer; and
forming a gas barrier layer,
on the substrate, wherein
at least one polymer layer is formed by a plasma CVD method.
(8) A method of producing the gas barrier laminate of any one of Items (1) to (6) comprising the steps of:
forming a polymer layer; and
forming a gas barrier layer,
on the substrate, wherein
all the polymer layer is formed by a plasma CVD method.
(9) The method of Item (7) or (8), wherein the plasma CVD method is carried out under an atmospheric pressure or a near atmospheric pressure.

In the following, the best aspects to conduct the present invention will be described in detail.

As a result of the investigation by the inventors, it is found that a gas barrier laminate having high gas barrier ability, improved adhesiveness among the substrate, polymer layer and the bas barrier layer, and excellent bending resistance and environmental resistance can be realized by a gas barrier laminate wherein 1) at least one polymer layer is provided adjacent to at least one gas barrier layer and the average carbon content at the contact interface between the polymer layer and the gas barrier layer is lower than the average carbon content in the polymer layer, 2) at least one polymer layer is provided adjacent to the substrate and the average carbon content at the contact interface of the polymer layer and the substrate is higher than the average carbon content in the polymer layer other than the contact interface or 3) at least one polymer layer is provided adjacent to at least one gas barrier layer and the average carbon content of the polymer layer at the contact interface between the gas barrier layer is lower than average carbon content in the polymer layer, and at least one polymer layer is provided adjacent to the substrate and the average carbon content at the contact interface between the polymer layer and the substrate is higher than the average carbon content in the polymer layer other than that of the contact interface. Thus the present invention is attained. In the present invention, the contact interface between the polymer layer and the substrate or the contact interface between the polymer layer and the gas barrier layer is defined as 10% of the thickness of the layer from the contact interface when the thickness of the polymer layer is set at 100%.

In a preferable embodiment of the present invention of the gas barrier laminate which has at least one gas barrier layer and one polymer layer, the adhesiveness between the substrate and the polymer layer adjacent to the substrate and the adhesiveness between the polymer layer and the gas barrier layer can be considerably improved by setting the condition so as to make the average carbon content at the contact interface between the substrate is the highest, to make the carbon content decrease toward the gas barrier layer formed on the polymer layer and to make, on the contrary, the metal oxide content increase toward the gas barrier layer.

When the polymer layer and the gas barrier layer are arranged so as to be adjacent with each other, the adhesiveness between the polymer layer and the gas barrier layer can be improved and pinhole defects caused by bending the polymer layer or occurrence of cracks during storage for long time can be effectively inhibited by setting the condition so as to make the average carbon content at the contact interface between these layers lowest and to make the average carbon content increase at the central portion of the polymer layer.

The gas barrier laminate is characterized in that the carbon content in the polymer layer is made to the specified pattern according to the arranged position of the polymer layer. As the method for forming the polymer layer which gives such the variation of carbon content to the polymer layer, a plasma CVD method is preferable. The plasma CVD method is preferably carried out under atmospheric pressure or near atmospheric pressure. The carbon content pattern prescribed in the present invention can be realized under exactly controlled condition by applying the plasma CVD method of the present invention.

The present invention will be described in detail below.

The gas barrier laminate at least has a gas barrier layer and a polymer layer.

<<Gas Barrier Layer>>

First, the gas barrier layer of the present invention is described.

The gas barrier layer of the present invention is a layer capable of blocking gas such as moisture and oxygen and is a thin layer principally composed of a ceramics component such as metal oxide and metal nitride. Thickness of the layer is usually 5 to 100 nm and has hardness relatively higher compared with the later-mentioned polymer layer, and the layer is defined as a layer having a average carbon content of less than 1%.

The gas barrier layer of the present invention is preferably formed by a sputtering method, a coating method, an ion assist method, the later-mentioned plasma CVD method or the later-mentioned plasma CVD method performed under atmospheric pressure or near atmospheric pressure, using the later mentioned raw material. More preferably, the gas barrier layer is formed by the plasma CVD method or the plasma CVD method performed under atmospheric pressure or near atmospheric pressure, and specifically preferably, the gas barrier layer is formed by the plasma CVD method performed under atmospheric pressure or near atmospheric pressure is particularly preferable. Detail of the layer forming conditions using the plasma CVD method will be mentioned later.

It is preferable that the gas barrier layer is obtained by using the plasma CVD method or the plasma CVD method performed under atmospheric pressure or near atmospheric pressure because a metal carbide, metal nitride, metal oxide, metal sulfide, metal halide and their mixture thereof (such as metal oxide-nitride, metal oxide-halide, and metal nitride-carbide) can be optionally produced by selecting an organometal compound as the raw material, decomposition gas, decomposition temperature and applying electric power.

For example, silicon oxide is formed by using a silicon compound as the raw material and oxygen as the decomposition gas, and zinc sulfide is formed by using a zinc compound as the raw material and carbon disulfide as the decomposition gas. In the space of plasma, very high actively charged particles or active radicals exist in high density. Therefore, plural steps of chemical reaction are accelerated in very high rate in the plasma space and the elements being in the plasma space is converted to the chemically stable compound within extremely short duration.

The state of the inorganic raw material may be gas, liquid or solid at room temperature as far as the raw material contains a typical metal element or a transition metal element. The gas can be directly introduced into the discharging space and the liquid or solid is used after vaporized by a method such as heating bubbling or applying ultrasonic wave. The raw material may be used after diluted by a solvent. An organic solvent such as methanol, ethanol, n-hexane and a mixture thereof can be used for such the solvent. The influence of the solvent can be almost ignored because the solvent is decomposed into molecular or atomic state by the plasma discharge treatment.

Examples of such the organic compound include a silicon compound such as silane, tetramethoxysilane, tetraethoxysilane, tetra-n-propoxysilane, tetra-iso-propoxsilane, tetra-n-butoxysilane, tetra-t-butoxysilane, dimethyldimethoxysilane, dimethyldiethoxysilane, diethyldimethoxysilane, diphenylsimethoxysilane, methyltriethoxysilane, ethyltrimethoxysilane, phenyltriethoxysilane, (3,3,3-trifluoropropyl)trimethoxysilane, hexamethyldisyloxane, bis(dimethylamino)dimethylsilane, bis(dimethylamino)methylvinylsilane, bis(ethylamino)dimethylsilane, N,O-bis(trimethylsilyl)acetoamide, bis(trimethylsilyl)carbodiimide, diethylaminotrimethylsilane, dimethylaminodimethylsilane, hexamethyldisilazane, heaxamethylcyclotrisilazane, heptamethylsilazane, nonamethyltrisilazane, octamethylcyclotetrasilazane, tetrakisdimethyaminosilazane, tetraisocyanatesilane, tetramethyldisilazane, tris(dimethylamino)silane, triethoxyfluorosilane, allyldimethylsilane, allyltrimethylsilane, benzyltrimethylsilane, bis(trimethylsilyl)acetylene, 1,4-bistrimethylsilyl-1,3-butadiine, di-t-butylsilane, 1,3-disilabutane, bis(trimethylsilyl)methane, cyclopentanedienyltrimethylsilane, phenyldimethylsilane, phenyltrimethylsilane, propagyltrimethylsilane, tetramethylsilane, trimethylsilylacetylene, 1-(trimethylsilyl)-1-propine, tris(trimethylsilyl)methane, tris(trimethylsilyl)silane, vinyltrimethylsilane, hexamethyldisilane, octamethylcyclotetrasiloxane, tetramethylcycloteteasiloxane, heaxmethylcycrotetrasiloxane and M-silicate 51.

Examples of the titanium compound include titanium methoxide, titanium ethoxide, titanium isopropoxide, titanium tetraisoboroxide, titanium n-butoxide, titanium isopropoxide(bis-2,4-pentanedionate), titanium diisopropoxide (bis-2,4-ethylacetoacetate), titanium di-n-butoxide(bis-2,4-pentanedionate), titanium caetylacetonate and butyl titanate dimer.

Examples of the zirconium compound include zirconium n-propoxide, zirconium n-butoxide, zirconium t-butoxide, zirconium tri-n-butoxide acetylacetonate, zirconium di-n-butoxide bisacetylacetonate, zirconium acetylacetonate, zirconium acetate and zirconium heaxafluoropentanedionate.

Examples of the aluminum compound include aluminum ethoxide, aluminum triisopropoxise, aluminum isopropoxide, aluminum n-butoxide, aluminum s-butoxide, aluminum t-butoxide, aluminum acetylacetonate and triethyldialuminum tri-s-butoxide.

Examples of the boron compound include diborane, boron fluoride, boron chloride, boron bromide, borane-diethyl ether complex, borane-THF complex, borane-dimethyl sulfide complex, borane trifluoride-diethyl ether complex, triethylborane, trimethoxyborane, triethoxyborane, tri(isopropoxy)borane, borazole, trimethylborazole, triethylborazole and triisopropylborazole.

Examples of the tin compound include teraethyltin, tetramethyltin, diaceto-di-n-butyltin, terabutyltin, tetraoctyltin, tetraethoxytin, methyltriethoxytin, diethyldiethoxytin, triisopropylethoxytin, diethyltin, dimethyltin, diisopropyltin, dibutyltin, diethoxytin, dimethoxtin, diisopropoxytin, dibutoxytin, tin dibutylate, tin acetoacetonate, ethyltin acetoacetonate, ethoxytin acetoacetonate, dimethyltin acetoacetonate, tin hydride and tin halide such as tin dichloride and tin tetrachloride.

Examples of another organic metal compound include antimony ethoxide, arsenic triethoxide, barium 2,2,6,6-tetramethylheptanedionate, beryllium acetylacetonate, bismuth hexafluoropnetanedionate, dimethylcadmium, calcium 2,2,6,6-tetramethylheptanedionate, chromium trifluoropentanedionate, cobalt cetylacetonate, copper hexafluoropentanedionate, magnesium heaxfluoropentane-dionate-dimethyl ether complex, gallium ethoxide, tetraethoxygermanium, hafnium t-butoxide, hafnium ethoxide, indium acetylacetonate, indium 2,6-dimethylamino-heptanedionate, ferrocene, lanthanum isopropoxide, lead acetate, tetraethyllead, neodium acetylacetonate, platinum hexafluoropentanedionate, trimethylcyclopentanedienyl-platinum, rhodium dicarbonylacetylacetonate, strontium 2,2,6,6-tetramethylheptanedionate, tantalum methoxide, tantalum trifluoroethoxide, tellurium ethoxide, tungsten ethoxide, vanadium triisopropoxideoxide, magnesium hexafluorocetylacetonate, zinc acetylacetonate and diethylzinc.

Examples of the decomposition gas for decomposing the raw material gas containing the metal to form an inorganic compound include hydrogen gas, methane gas, acetylene gas, carbon monoxide gas, carbon dioxide gas, nitrogen gas, ammonium gas, nitrogen suboxide gas, nitrogen oxide gas, nitrogen dioxide gas, oxygen gas, steam, fluorine gas, hydrogen fluoride, trifluoroalcohol, trifluorotoluene, hydrogen sulfide, sulfur dioxide, carbon disulfide and chlorine gas.

Various kinds of metal carbide, metal nitride, metal oxide, metal halide and metal sulfide can be obtained by suitably selecting the metal element-containing raw material gas and the decomposition gas.

Such the reactive gas is mixed with a discharging gas capable of easily becoming into a plasma state and sent into the plasma discharge generation apparatus. Nitrogen gas and/or an atom of Group 18 of periodic table such as helium, neon, argon, krypton, xenon and radon are used for such the discharging gas. Of these, nitrogen, helium and argon are preferably used.

The discharging gas and the reactive gas are mixed to prepare a mixed gas and supplied into the plasma discharge (plasma generating) apparatus to form the layer. The reactive gas is supplied in a ratio of the discharging gas to whole mixture of the gases of 50% or more although the ratio is varied depending on the properties of the layer to be formed.

<<Polymer Layer>>

Next, the polymer layer will be explained.

The polymer layer of the present invention is a thin layer containing, for example, an inorganic polymer, an organic polymer, or an organic-inorganic hybrid polymer as a main component, and has a thickness of 5-500 nm. The hardness of the polymer layer is relatively low compared to that of the above mentioned barrier layer. The average carbon content in the polymer layer is not less than 5%. The polymer layer is also referred to as a stress relaxation layer.

The inorganic polymer applicable in the present invention has an inorganic skeleton as the main structure and contains an organic component including a polymerized organometallic compound.

The inorganic polymer is not specifically limited, and employable are, for example: silicon compounds such as silicone and polysilazane, a titanium compound, an aluminium compound, a boron compound, a phosphorus compound, and a tin compound.

The Silicon compound employed in the present invention is not specifically limited, however, preferable examples include: tetramethylsilane, trimethylmethoxysilane, dimethyldimethoxysilane, methyltrimethoxysilane, trimethylethoxysilane, dimethyldiethoxysilane, methyltriethoxysilane, tetramethoxysilane, hexamethyldisiloxane, hexamethyldisilazane, 1,1-dimethyl-1-silacyclobutane, trimethylvinylsilane, methoxydimethylvinylsilane, trimethoxyvinylsilane, ethyltrimethoxysilane, dimethyldivinylsilane, dimethylethoxyethynylsilane, diacetoxydimethylsilane, dimethoxymethyl-3,3,3-trifluoropropylsilane, 3,3,3-trifluoropropyltrimethoxysilane, aryltrimethoxysilane, ethoxydimethylvinylsilane, arylaminotrimethoxysilane, N-methyl-N-trimethylsilylacetamide, 3-aminopropyltrimethoxysilane, methyltrivinylsilane, diacetoxymethylvinylsilane, methyltriacetoxysilane, aryloxydimethylvinylsilane, diethylvinylsilane, butyltrimethoxysilane, 3-aminopropyldimethylethoxySilane, tetravinylsilane, triacetoxyvinylsilane, tetraacetoxysilane, 3-trifluoroacetoxypropyltriaceoxysilane, diaryldimethoxysilane, butyldimethoxyvinylsilane, trimethyl-3-vinylthiopropylsilane, phenyltrimethylsilane, dimethoxymethylphenylsilane, phenyltrimethoxsilane, 3-acryloxypropyldimethoxymethylsilane, 3-acryloxypropyltrimethoxysilane, dimethylisopentyloxyvinylsilane, 2-aryloxyethyltiomethoxytrimethylsilane, 3-glycidoxypropyltrimethoxysilane, 3-arylaminopropyltrimethoxysilane, hexyltrimethoxysilane, heptadecafluorodecyltrimethoxysilane, dimethylethoxyphenylsilane, benzyloxytrimethylsilane, 3-methacryloxypropyldimethoxymethylsilane, 3-methacryloxypropyltrimethoxysilane, 3-isocyanatepropyltriethoxysilane, dimethylethoxy-3-glycidoxypropylsilane, dibutoxudimethylsilane, 3-butylaminopropyltrimethylsilane, 3-dimethylaminopropyldiethoxymethylsilane, 2-(2-aminoethylthioethyl)triethoxysilane, bis(butylamino)dimethylsilane, divinylmethylphenylsilane, diacetoxymethylphenylsilane, dimethyl-p-tolylvinylsilane, p-styryltrimethoxysilane, diethylmethylphenylsilane, benzyldimethylethoxysilane, diethoxmethylphenylsilane, decylmethyldimethoxysilane, diethox-3-glycidoxypropylmethylsilane, octyloxytrimethylsilane, phenyltrivinylsilane, tetraaryloxysilane, dodecyltrimethylsilane, diarylmethylphenylsilane, diphenylmethylvinylsilane, diphenylethoxymethylsilane, diacetoxydiphenylsilane, dibenzyldimethylsilane, diaryldiphenylsilane, octadecyltrimethylsilane, methyloctadecyldimethylsilane, docosylmethyldimethylsilane, 1,3-divinyl-1,1,3,3-tetramethyldisiloxane, 1,3-divinyl-1,1,3,3-tetramethyldisilazane, 1,4-bis(dimethylvinylsilyl)benzene, 1,3-bis(3-acetoxypropyl)tetramethyldisiloxane, 1,3,5-tris(3,3,3-trifluoropropyl)-1,3,5-trimethylcyclotrisiloxane, octamethylcyclotetrasiloxane, 1,3,5,7-tetraethoxy-1,3,5,7-tetramethylcyclotetrasiloxane and decamethylcyclopentasiloxane.

Further, as an organic polymer, well-known polymerizable organic compounds can be used. Of these, preferable is a polymerizable ethylenically unsaturated organic compound having an ethylenically unsaturated bond in the molecule. Also usable are: common radically polymerizable monomers; and multifunctional monomers or multifunctional oligomers having a plurality of addition polymerizable ethylenically unsaturated bonds in the molecule, which are commonly used as a resin curable with light, heat or UV rays.

These polymerizable ethylenically unsaturated organic compounds are not specifically limited, however, preferable examples include: monofunctional acrylic esters such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryloxyethyl acrylate, tetrahydrofurfuryloxyhexanolide acrylate, acrylate of 1,3-dioxanealcohol added with ∈-caprolactone and 1,3-dioxolane acrylate, and esters of methacrylic acid, itaconic acid, crotonic acid and maleic acid, in which acrylate portions of the above compounds are replaced to form methacrylates, itaconates, crotonates and maleates, respectively; bifunctional acrylates such as ethylene glycol diacrylate, triethylene glycol diacrylate, pentaerythritol diacrylate, hydroquinone diacrylate, resorcinol diacrylate, hexanediol diacrylate, neopentyllycol diacrylate, tripropylene glycol diacrylate, diacrylate of neopentylglycol hydroxypivaliate, diacrylate of neopentylglycol adipate, diacrylate of neopentylglycol hydroxypivaliate added with s-caprolactone, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate added with ∈-caprolactone and diacrylate of diglycidyl ether of 1,6-hexane, and esters of methacrylic acid, itaconic acid, crotonic acid and maleic acid, in which acrylate portions of the above compounds are replaced to form methacrylates, itaconates, crotonates and maleates, respectively; multifunctional acrylates such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate added with ∈-caprolactone, pyrogallol triacrylate, propionic acid.dipentaerythritol triacrylate, propionic acid.dipentaerythritol tetraacrylate and hydroxypivalylaldehyde modified dimethylolpropane triacrylate, and esters of methacrylic acid, itaconic acid, crotonic acid and maleic acid, in which acrylate portions of the above compounds are replaced to form methacrylates, itaconates, crotonates and maleates, respectively.

Also, a prepolymer can be used as well as the above-mentioned. One or more kinds of prepolymers may be used in combination or may be used by mixing with the above-mentioned monomer and/or oligomer.

Examples of a prepolymer include prepolymers of: polyester acrylates prepared by introducing a (meth)acrylic acid into a polyester obtained by a reaction of a polybasic acid such as adipic acid, trimellitic acid, maleic acid, phthalic acid, terephthalic acid, himik acid, malonic acid, succinic acid, glutaric acid, itaconic acid, pyromellitic acid, fumaric acid, glutaric acid, pimelic acid, sebacic acid, dodecanoic acid, or tetrahydrophthalic acid, and a polyalcohol such as ethylene glycol, propylene glycol, diethylene glycol, propylene oxide, 1,4-butanediol, triethylene glycol, tetraethylene glycol, polyethylene glycol, glycerol, trimethylol propane, pentaerythritol, sorbitol, 1,6-hexanediol or 1,2,6-hexanetriol; epoxy acrylates prepared by introducing a (meth)acrylic acid into an epoxy resin, for example, bisphenol A.epichlorohydrin. (meth)acrylic acid and phenolnovolak.epichlorohydrin. (meth)acrylic acid; urethane acrylates prepared by introducing a (meth)acrylic acid into an uretane resin, for example, ethylene glycol.adipic acid.tolylenediisocyanate.2-hydroxyethyl acrylate, polyethylene glycols.tolylenediisocyanate.2-hydroxyethyl acrylate, hydroxyethylphthalyl methacrylate.xylenediisocyanate, 1,2-polybutadiene glycol.tolylenediisocyanate.2-hydroxyethyl acrylate and trimethylolpropane.propylene glycol.tolylenediisocyanate.2-hydroxyethyl acrylate; acrylates of silicone resin, for example, polysiloxane acrylate and polysiloxane.diisocyanate.2-hydroxyethyl acrylate; alkyd modified acrylates prepared by introducing a (meth)acryloyl group into an oil modified alkyd resin; and acrylates of spirane resin.

The organic polymer employable in the polymer layer of the present invention can also be formed by using a plasma polymerizable organic compound as a film forming gas. Examples of a plasma polymerizable organic compound include: hydrocarbons, vinyl compounds, halogen-containing compounds and nitrogen-containing compounds.

Examples of a hydrocarbon include: ethane, ethylene, methane, acetylene, cyclohexane, benzene, xylene, phenylacetylene, naphthalene, propylene, canfor, menthol, toluene and isobutylene.

Examples of a vinyl compound include: acrylic acid, methyl acrylate, ethyl acrylate, methyl methacrylate, allyl methacrylate, acrylamide, styrene, α-methylstyrene, vinylpyridine, vinyl acetate and vinylmethyl ether.

Examples of a halogen-containing compound include: tetrafluoromethane, tetrafluoroethylene, hexafluoropropylene and fluoroalkyl methacrylate.

Examples of a nitrogen-containing compound include: pyridine, allylamine, butylamine, acrylonirile, acetonitrile, benzonitrile, methacrylonitrile and aminobenzene.

The organic-inorganic hybrid polymer layer of the present invention includes a layer composed of an organic (inorganic) polymer in which an inorganic (organic) substance is dispersed and a layer having both of an inorganic skeleton and an organic skeleton as the principal skeleton. Though the organic-inorganic hybrid polymer applicable to the present invention is not specifically limited, one composed by suitable combination of the foregoing inorganic polymer and organic polymer.

In the polymer layer of the present invention, it is characterized in that the carbon content is set so that the content is made to highest at the contact interface of the polymer layer being adjacent to the substrate and the substrate and the carbon content at the contact interface of the polymer layer and the gas barrier layer is made to lowest.

As above-mentioned, the contact interface in the present invention is an area of 10% in the direction of the layer thickness when the entire thickness of the layer is defined as 100%, the average carbon content at the contact interface is the average value of content of carbon contained in this area. The average carbon content is atomic concentration in percent measured by the later-mentioned XPS.

Difference between the average carbon content of the polymer and the average carbon content at the contact interface of the polymer layer is preferably not less than 2% and more preferably not less than 6%.

FIG. 1 is a schematic drawing showing an example of the constitution and the distribution of the carbon content in the gas barrier layer of the present invention.

In FIG. 1, a gas barrier layer is shown which is constituted by two gas barrier layers G-1 and G-2 and three polymer layers P-1, P-2 and P-3.

The gas barrier layer is constituted by providing the polymer layer P-1 formed on a substituted F and providing the gas barrier layer G-1 on the polymer layer P-1, and further providing successively the polymer layer P-2, gas barrier layer G-2 and the polymer layer P-3 as the outermost layer.

It is one of the characteristics of the present invention that the carbon content of the polymer layer adjacent to the substrate is made highest at the contact interface of the polymer layer with the substrate. In FIG. 1, it is characterized that the average carbon content in the contact interface represented by C-1 (the interface represented by 0.1t when the entire layer thickness of the polymer layer P-1 is represented by t) is higher than the average carbon content in the area of polymer layer P-1 other than the contact interface C-1. Namely, the polymer layer P-1 has the carbon content profile shown at the right side of the cross section.

The present invention is further characterized in that the average carbon content is made lowest at the contact interface of the polymer layer when the polymer layer is adjacent to the gas barrier layer. In FIG. 1, the average carbon contents in the interface C-2 of the polymer layer P-1, the interfaces C-3 and C-4 of the polymer layer P-2 which is arranged between the gas barrier layers G-1 and G-2, and the interface C-5 of the polymer layer P-3 are each smaller than that in each of the polymer layers, respectively, and the profile of the average carbon content is formed as shown at right side of the cross section.

The carbon content profile in the outermost polymer layer P-3 may be a pattern in which the carbon content is lower in both of the faces such as shown in a) or the average carbon content is lowest at the interface G-5 and becomes higher toward the surface such as shown in b).

In the present invention, the atomic concentration representing the carbon content is calculated by the following XPS method and is defined as follows.

Atomic concentration=Number of carbon atoms/Number of whole atoms×100

(Analysis of Composition of Polymer Layer Using XPS)

The elements constituting the constituting layer of the electroconductive film of the invention can be analyzed by an XPS (X-ray photoelectron spectroscopy) surface analyzing apparatus. In the invention, an X-ray photoelectron spectroscopic surface analyzing apparatus ESCALAB-200R manufactured by VG Scientifix Co., Ltd. was uses.

Specifically, the measurement was carried out by an X-ray of 600 W (acceleration voltage: 15 kV, emission current: 40 mA) using an X-ray anode of Mg. The energy resolution was set to 1.5 eV to 1.7 eV when expressed by a half width value of the peak of cleared Ag3d5/2.

Composition analysis of the surface of the polymer layer was carried out first. Subsequently, measurement was carried out by etching every 10% of the thickness of the polymer layer. For removing the polymer layer, an ion gun capable of using a rare gas ion was preferably applied. As the ion species, He, Ne, Ar, Xe and Kr were usable. In the measurement, the polymer layer was sequentially removed by Ar ion etching.

First, the kind of detectable element was searched by measuring in the range of bonding energy of from 0 eV to 1,100 eV with a sampling interval of 1.0 eV.

Next, slow scanning was performed for detecting photoelectron peaks giving the maximum intensity by a signal input interval of 0.2 eV about entire elements other than the ion used for the etching for measuring spectra of each of the elements.

The obtained spectra were transferred to Common Data Processing Process (preferably after Ver. 2.3) manufactured by VAMAS-SCA-Japan and processed by the same soft wear for canceling the difference in the content ratio calculation results caused by difference of the measuring apparatus, or computer. Thus the content of each of the target elements (such as carbon, oxygen, silicon and titanium) was obtained in the concentration of number of atoms (atomic concentration: at %).

Count scale calibration was applied for each of the elements before the determination treatment and the results were subjected to 5-point smoothing. The peak area intensity (esp*eV) after removing the background was used for determination treatment. The method by Shirley was applied for treatment of back group. D. A. Shirley, Phys. Rev., B5, 4709 (1972) can be referred about the method of Shirley.

The polymer layer of the present invention can be formed by a dry process such as a vacuum evaporation method, a sputtering method, a CVD (chemical vapor deposition) method and a plasma CVD method carried out under the atmospheric pressure or near atmospheric pressure. In the gas harrier material production method of the present invention, the polymer layer having the specified carbon content profile defined as above is characteristically formed by forming at least one of the polymer layers, preferably entire polymer layers, by the plasma CDV method and preferably by the plasma CVD method carried out under the atmospheric pressure or near atmospheric pressure, hereinafter also referred to as a atmospheric pressure plasma CVD method. The atmospheric pressure plasma CVD method is described in detail later.

A composite thin layer can be formed by the CVD method since raw material gases can be mixed in an optional ratio. Moreover, the CVD method is preferable because the supplying ratio of the plural gases as the raw materials can be continuously varied in the course of the layer formation to continuously change the carbon content in the polymer layer.

The carbon content in the polymer layer of the present invention obtained by the atmospheric pressure plasma CVD method can be controlled with extremely high preciseness by optionally selecting conditions such as kind and ratio of an inorganic polymer (including an organic metal compound), an organic polymer or a inorganic-organic hybrid polymer as the raw materials, decomposition gas, decomposition temperature, inputting electric power and frequency of the electric power source. In the present invention, an organic metal compound containing a metal the same as that containing in the barrier layer is preferably used since particularly high adhesiveness, resistivity to bending and resistivity to environmental condition can be obtained by the use of such the compound.

These gases are mixed with a discharging gas which is easily converted to a plasma state and sent into a plasma discharge generating apparatus. As such the discharging gas (inert gas), nitrogen gas and/or atoms of $18^{th}$ Group of periodic table such as helium, neon, argon, krypton, xenon and radon are usable. Among them, nitrogen, helium and argon are preferably used.

The layer is formed by mixing the above discharging gas and the reactive gas to form a mixed gas and supplying the mixed gas into the plasma discharge generation apparatus (the plasma generation apparatus). Though the ratio of the discharging gas and the reactive gas is varied according to the properties of the layer to be obtained, the ratio of the discharging gas is made to not less than 50% of the enter mixing gas for supplying the reactive gas.

When the polymer layer is formed by the plasma CVD method, the carbon content of the polymer layer can be controlled by suitably controlling the inputting electric power, the supplying amount of reactive gas and the frequency of the power source though the controlling method is not specifically limited. Larger inputting electric power causes lower carbon content and smaller power causes higher carbon content, larger supplying amount of the reactive gas causes higher carbon content and smaller amount or the reactive gas causes lower carbon content and higher frequency of power source causes lower carbon content and higher frequency causes lower carbon content.

<<Substrate>>

Next, the substrate of the present invention is described below.

A transparent resin substrate is preferable for the substrate to be used in the gas barrier laminate element though the substrate is not specifically limited. Examples of the substrate include a cellulose ester such as cellulose triacetate, cellulose diacetate, cellulose acetate propionate and cellulose acetate butylate, a polyester such as poly(ethylene terephthalate) and poly(ethylene naphthalate), a polyolefin such as polyethylene and polypropylene, poly(vinylidene chloride), poly(vinyl chloride), poly(vinyl alcohol), ethylene-vinyl alcohol copolymer, syndiotactic polystyrene, polycarbonate, norbonene resin, polymethylpentene, polyetherketone, polyimide, polyethersulfone, polysulfone, polyetherimide, polyamide, fluororesin, poly(methyl acrylate) and an acrylate copolymer.

These materials can be used singly or in suitable combination. Particularly, ones available on the market such as Zeonex and Zeonoa manufactured by Nihon Zeon Co., Ltd., amorphous cyclopolyolefin film Arton manufactured by JSR Co., Ltd., polycarbonate film Pure-ace manufactured by Teijin Co., Ltd., and cellulose triacetate film Konicatac KC4UX and KC8U each manufactured by Konica Minolta Opt Co., Ltd., are preferably usable.

The substrate to be used in the present invention is not limited to the above-mentioned. Thickness of the substrate in a film form is preferably from 10 to 1,000 μm and more preferably from 40 to 500 μm.

Steam permeaability of the gas barrier laminate of the present invention is preferably less than 0.1 $g/m^2/day$ measured according to the method of JIS K7129 B when the gas barrier material is used for the organic EL display or the high definition color liquid crystal display which requires high steam barrier ability.

<<Plasma CVD Method>>

Next, the plasma CVD method and the plasma CVD method under atmospheric pressure, which can be preferably employed to form the polymer layer and the gas barrier layer of the present invention in the production method of the gas barrier laminate of the present invention will be explained further in detail.

The plasma CVD method of the present invention will now be explained.

The plasma CVD method is also called as plasma enhanced chemical vapor deposition method or PECVD method, by which a layer of various inorganic substances having high covering and contact ability can be formed on any solid-shaped body without excessively raising the temperature of the substrate.

The usual CVD method (chemical vapor deposition method) is a method in which the evaporated or sublimated organic metal compound is stuck onto the surface of the substrate at high temperature and thermally decomposed to form a thin layer of a thermally stable inorganic substance. Such the usual CVD method (also referred to as a thermal CVD method) cannot be applied for layer forming on the plastic substrate since the substrate temperature is not less than 500° C.

In the plasma CVD method, a space in which gas is in the plasma state (a plasma space) is generated by applying voltage in the space near the substrate. Evaporated or sublimated organometal compound is introduced into the plasma space and decomposed, followed by being blown onto the substrate to form a thin layer of inorganic substance. In the plasma space, the gas of a high ratio of several percent is ionized into ions and electrons, and the electron temperature is very high while the gas is held at low temperature. Accordingly, the organometal compound which is the raw material of the inorganic layer can be decomposed by contacting with the high temperature electrons and the low temperature but excited state of ion radicals. Therefore, the temperature of the substrate on which the inorganic layer is formed can be kept low, and thus the layer can be sufficiently formed even on a plastic substrate.

However, since it is necessary to apply an electric field to the gas for ionizing the gas into the plasma state, the film has usually been produced in a space reduced in the pressure of from about 0.101 kPa to 10.1 kPa. Accordingly the plasma CVD equipment has been large and the operation has been complex, resulting in suffering from a problem of productivity.

In the plasma CVD method under near atmospheric pressure, not only the reduced pressure is not necessary, resulting in a high productivity, but also a high layer forming rate is obtained since the density of the plasma is higher. Further a notably flat film compared to that obtained via usual plasma CVD method is obtained, since mean free path of the gas is considerably short under the high pressure condition namely an atmospheric pressure. Thus obtained flat film is preferable with respect to the optical property or the gas barrier property. As described above, in the present invention, the plasma CVD method under near atmospheric pressure is more preferable than the plasma CVD method under vacuum.

The apparatus for forming the polymer layer or the gas barrier layer by the plasma CVD method under the atmospheric pressure or near atmospheric pressure is described in detail below.

An example of the plasma layer forming apparatus to be used in the gas barrier material producing method of the present invention for forming the polymer layer or the gas barrier layer is described referring FIGS. 2 to 5. In the drawings, F is a long length film as an example of the substrate.

FIG. 2 is a schematic drawing of an example of an atmospheric pressure plasma discharge apparatus by jet system available for the present invention.

Figure 3:
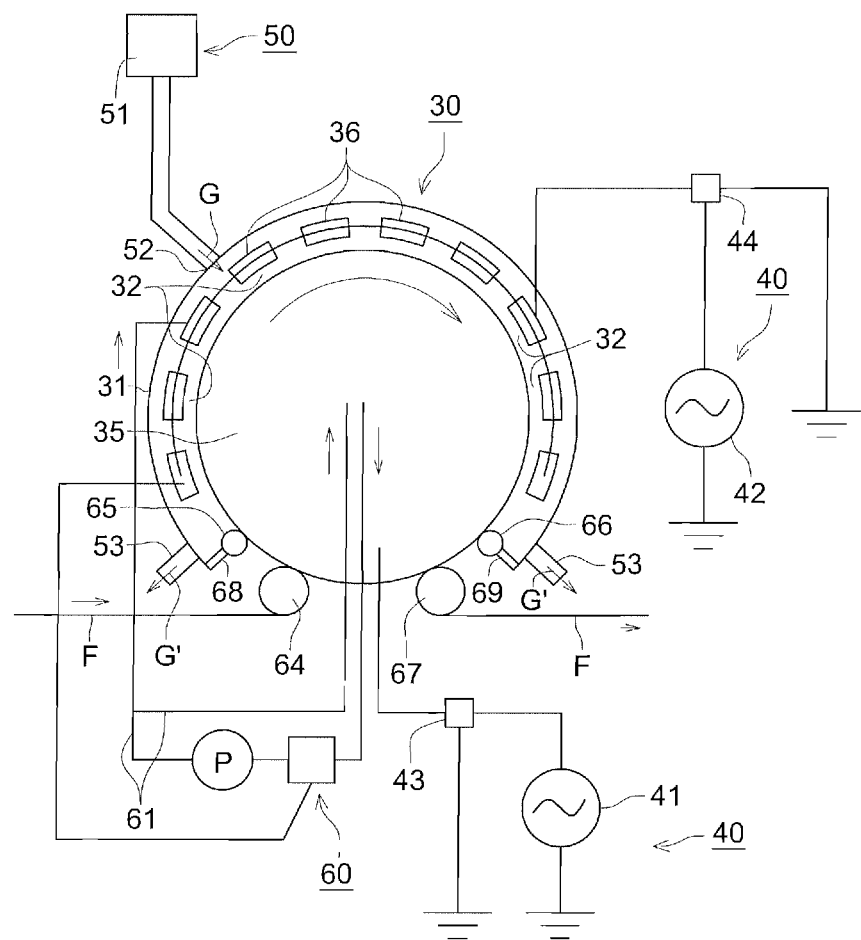
FIG. 3 is a schematic illustration of an atmospheric pressure plasma discharge apparatus in which a substrate is treated between the facing electrodes, useful for the present invention.

The jet system atmospheric pressure discharge apparatus is an apparatus having a gas supplying means and an electrode temperature controlling means, which are not described in FIG. 2 and shown in FIG. 3, additionally to a plasma discharge apparatus and an electric field applying means with two electric power sources.

A plasma discharge apparatus 10 has facing electrodes constituted by a first electrode 11 and a second electrode 12. Between the facing electrodes, first high frequency electric field with frequency of $\omega_1$, electric field strength of $V_1$ and electric current of $I_1$ supplied by the first power source 21 is applied by the first electrode 11 and second high frequency electric field with frequency of $\omega_2$, electric field strength of $V_2$ and electric current of $I_2$ supplied by the second power source 32 is applied by the second electrode 12. The first power source 21 can supply high frequency electric field strength higher than that by the second power source 22 ($V_1 > V_2$) and the first power source 21 can supply frequency $\omega_1$ lower than the frequency $\omega_2$ supplied by the second power source 22.

A first filter 23 is provided between the first electrode 11 and the first power source 12 so that the electric current from the first power source 21 is easily passed to the first electrode 11 and the current from the second power source 22 is difficulty passed to the first electrode 11 by grounding the current from the second power source 22 to the first power source 21.

A second filter 24 is provided between the first electrode 12 and the first power source 22 so that the electric current from the second power source 22 is easily passed to the second electrode and the current from the first power source 21 is difficulty passed to the second electrode by grounding the current from the first power source 21 to the second power source.

Gas G is introduced from a gas supplying means such as that shown in FIG. 3 into the space (discharging space) between the facing first electrode 11 and the second electrode 12, and discharge is generated by applying high frequency electric field from the first and second electrodes so as to make the gas to plasma state and the gas in the plasma state is jetted to the under side (under side of the paper if the drawing) of the facing electrodes so as to fill the treatment space constituted by under surfaces of the facing electrodes and the substrate F by the gas in the plasma state, and then the thin layer is formed near the treatment position 14 on the substrate F conveyed from the bulk roll of the substrate by unwinding or from the previous process. During the layer formation, the electrodes are heated or cooled by a medium supplied from the electrode temperature controlling means trough the pipe. It is preferable to suitably control the temperature of the electrodes because the physical properties and the composition are varied sometimes according to the temperature of the substrate on the occasion of the plasma discharge treatment. As the medium for temperature control, an insulation material such as distilled water and oil. It is desired that the temperature at the interior of the electrode is uniformly controlled so that ununiformity of temperature in the width direction and length direction of the substrate is made as small as possible on the occasion of the plasma discharge treatment.

A plurality of the atmospheric pressure plasma discharge treating apparatus by the jetting system can be directly arranged in series for discharging the same gas in plasma state at the same time. Therefore, the treatment can be carried out plural times at high rate. Furthermore, a multilayer composed of different layers can be formed at once by jetting different gases in plasma state at the different apparatuses, respectively.

FIG. 3 is a schematic drawing of an example of the atmospheric pressure discharge apparatus for treating the substrate between the facing electrodes effectively applied for the present invention.

The atmospheric pressure plasma discharge apparatus of the present invention at least has a plasma discharge apparatus 30, an electric field applying means having two electric power sources 40, a gas supplying means 50 and an electrode temperature controlling means 60.

In the apparatus shown in FIG. 3, the thin layer is formed by plasma discharge treating the substrate F in a charge space 32 constituted between a rotatable roller electrode (first electrode) 35 and a group of square pillar-shaped electrodes (second electrode) 36.

The first high frequency electric field with frequency $\omega_1$, electric field strength $V_1$ and electric current $I_1$ supplied from a first power source 41 and the second high frequency electric field with frequency $\omega_2$, electric field strength $V_2$ and electric current $I_2$ supplied from a second power source 42 are each applied to the discharging space 32 (between the facing electrodes) formed between the rotatable roller electrode (first electrode) 35 and the square pillar-shaped fixed electrode group (second electrode) 36 by the first and the second electrode, respectively.

A first filter 43 is provided between the rotatable roller electrode (first electrode) 35 and the first power source 41 and the first filter 43 is designed so that the electric current from the first power source 41 to the first electrode is easily passed and the electric current from the second power source 42 to the first electrode is difficulty passed by grounding. Furthermore, a second filter 44 is provided between the square pillar-shaped fixed electrode (second electrode) 36 and the second power source 42 and the second filter 44 is designed so that the electric current from the second power source 42 to the second electrode is easily passed and the electric current from the first power source 41 to the second electrode is difficulty passed by grounding.

In the present invention, it is allowed to use the rotatable roller electrode 35 as the second electrode and the square pillar-shaped fixed electrode 35 as the first electrode. In all cases, the first power source is connected to the first electrode and the second power source is connected to the second electrode. The first electrode preferably supplies high frequency electric field strength larger than that of the second power source ($V_1 > V_2$). The frequency can be $\omega_1 < \omega_2$.

The electric current is preferably $I_1 < I_2$. The electric current $I_1$ of the first high frequency electric field is preferably from 0.3 mA/cm$^2$ to 20 mA/cm$^2$ and more preferably from 1.0 mA/cm$^2$ to 20 mA/cm$^2$. The electric current $I_2$ of the second high frequency electric field is preferably from 10 mA/cm$^2$ to 100 mA/cm$^2$ and more preferably from 20 mA/cm$^2$ to 100 mA/cm$^2$.

Gas G generated by a gas generating apparatus 51 of the gas generating means 50 is controlled in the flowing amount and introduced into a plasma discharge treatment vessel 31 through a gas supplying opening 52.

The substrate F is unwound from a bulk roll not shown in the drawing or conveyed from a previous process and introduced into the apparatus trough a guide roller 64. Air accompanied with the substrate is blocked by a nipping roller 65. The substrate F is conveyed into the space between the square pillar-shaped fixed electrode group and the rotatable roller electrode (first electrode) 35 while contacting and putting round with the rotatable roller electrode. Then the electric field is applied by both of the rotatable roller electrode (first electrode) and the square pillar-shaped fixed electrode group (second electrode) 36 for generating discharging plasma in the space 32 (discharging space) between the facing electrodes. A thin layer is formed by the gas in the plasma state on the substrate while contacting and putting round with the rotatable roller electrode 35. After that, the substrate F is wound up by a winder not shown in the drawing or transported to a next process through a nipping roller 66 and a guide roller 67.

The exhaust gas G' after the treatment is discharged from an exhaust opening 53.

For cooling or heating the rotatable roller electrode (first electrode) 35 and the square pillar-shaped fixed electrode group (second electrode) 36 during the thin layer formation, a medium controlled in the temperature by an electrode temperature controlling means 60 is sent to the both electrodes by a liquid sending pump P through piping 61 to control the temperature of the electrodes from the interior thereof. 68 and 69 are partition plates for separating the plasma discharging treatment vessel 31 from the outside.

Figure 4:
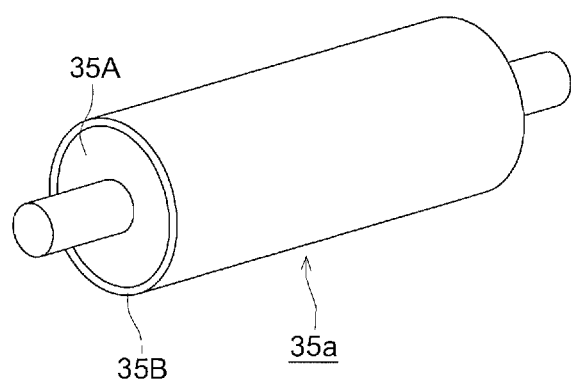
FIG. 4 is a perspective view of an example of a rotatable roller electrode having an electroconductive metal base material and a dielectric material covering the core material.

FIG. 4 shows an oblique view of the structure of an example of the rotatable roller electrode composed of an electroconductive metal base material and a dielectric material covering the core material.

In FIG. 4, the roller electrode 35a is composed of an electroconductive metal base 35A covered with a dielectric material 35B. The electrode is constituted so that the temperature controlling medium such as water and silicone oil can be circulated in the electrode for controlling the surface temperature of the electrode during the plasma discharging treatment.

Figure 5:
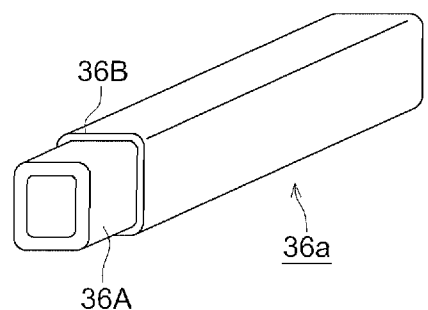
FIG. 5 is a perspective view of an example of a structure of an electroconductive metal base material and a dielectric material covering the core material used in a square pillar-shaped electrode.

FIG. 5 shows an oblique view of the structure of an example of the rotatable roller electrode composed of an electroconductive metal base material and a dielectric material covering the core material.

In FIG. 5, a square pillar-shaped electrode 36a is composed of an electroconductive metal base 36A having a cover of dielectric material 36B and the electrode constitutes a metal pipe forming a jacket so that the temperature can be controlled during the discharging.

The plural square pillar-shaped fixed electrodes are arranged along the circumstance larger than that of the roller electrode and the discharging area of the electrode is expressed by the sum of the area of the surface of the square pillar-shaped electrodes facing to the rotatable roller electrode 35.

The square pillar-shaped electrode 36a may be a cylindrical electrode but the square pillar-shaped electrode is preferably used in the present invention since the square pillar-shaped electrode is effective for increasing the discharging extent (discharging are) compared with the cylindrical electrode.

The roller electrode 35a and the square pillar-shaped electrode 36a shown in FIGS. 4 and 5 are each prepared by thermal spraying ceramics as the dielectric material 35B or 36B on the metal base 35A or 35B and subjecting to a sealing treatment using a an inorganic sealing material. The thickness of the ceramics dielectric material may be about 1 mm. As the ceramics material for the thermal spraying, alumina and silicon nitride are preferably used, among them alumina, which can be easily processed, is particularly preferred. The dielectric layer may be a lining treated dielectrics formed by lining an inorganic material.

For the electroconductive metal base material 35A and 36B, a metal such as metal titanium and a titanium alloy, silver, platinum, stainless steel, aluminum and iron, a composite material of iron and ceramics and a composite material of aluminum and ceramics are usable and the metallic titanium and titanium alloy are particularly preferable by the later-mentioned reason.

The distance between the facing first and second electrodes is the shortest distance between the surface of the dielectric layer and the surface of the electroconductive metal base material of the other electrode when the dielectric layer is provided on one of the electrodes, and is the shortest distance between the dielectric layer surfaces when the dielectric material is provided on both of the electrodes. Though the distance between the electrodes is decided considering the thickness of the dielectric material provided on the electroconductive metal base material, the strength of the applied electric field and the utilizing object of the plasma, the thickness is preferably from 0.1 to 20 mm and particularly preferably from 0.2 to 2 mm in any cases from the viewpoint for performing uniform discharge.

Details of the electroconductive metal base material and the dielectric useful in the present invention material will be described later.

Though the plasma discharging treatment vessel 31 is preferably a glass vessel such as Pyrex® glass, a metal vessel can be used when the vessel can be insulated from the electrodes. For example, one constituted by a frame of aluminum or stainless steel covered on inside thereof by polyimide resin or one constituted by such the thermal sprayed with ceramics for giving insulating ability are usable. The both side surfaces in parallel of the both electrodes (near the core material surface) is preferably covered with the above-described material.

Examples of the first power source (high frequency power source) employed in the atmospheric pressure plasma processing apparatus of the present invention include the following power sources:

| Reference Number | Maker | Frequency | Product name |
| --- | --- | --- | --- |
| A1 | Shinko Denki | 3 kHz | SPG3-4500 |
| A2 | Shinko Denki | 5 kHz | SPG5-4500 |
| A3 | Kasuga Denki | 15 kHz | AGI-023 |
| A4 | Shinko Denki | 50 kHz | SPG50-4500 |
| A5 | Heiden Kenkyusho | 100 kHz* | PHF-6k |
| A6 | Pearl Kogyo | 200 kHz | CF-2000-200k |
| A7 | Pearl Kogyo | 400 kHz | CF-2000-400k |

Any power source of the above can be used in the present invention.
Any power source of the above can be used in the present invention.

Examples of the second power source (high frequency power source include the following power sources:

| Reference Number | Maker | Frequency | Trade name |
| --- | --- | --- | --- |
| B1 | Pearl Kogyo | 800 kHz | CF-2000-800k |
| B2 | Pearl Kogyo | 2 MHz | CF-2000-2M |
| B3 | Pearl Kogyo | 13.56 MHz | CF-2000-13M |
| B4 | Pearl Kogyo | 27 MHz | CF-2000-27M |
| B5 | Pearl Kogyo | 150 MHz | CF-2000-150M |

Any power source of the above can be used in the present invention.

In the power sources above, "*" represents an impulse high frequency power supply (100 kHz in continuous mode) manufactured by Heiden Kenkyusho, and others are high frequency power supplies capable of applying electric field with only continuous sine wave.

In the present invention, it is preferable that the power source which enables to keep a uniform and stable discharge state with supplying such an electric field is employed in the atmospheric pressure plasma discharge apparatus.

In the present invention, when power is supplied across the facing electrodes, power (power density) of not less than 1 W/cm$^2$ is supplied to the second electrode (the second high frequency electric field) so as to excite the discharge gas to generate plasma. The energy is then given to the film forming gas, whereby a thin film is formed. and give the resulting energy to the discharge gas. The upper limit of the power supplied to the second electrode is preferably 50 W/cm$^2$, and more preferably 20 W/cm$^2$. The lower limit of the power supplied is preferably 1.2 W/cm$^2$. The discharge surface area (cm$^2$) refers to the surface area of the electrode at which discharge occurs.

Further, the power density can be enhanced while the uniformity of the second high frequency electric field is maintained, by supplying power (power density) of not less than 1 W/cm$^2$ to the first electrode (the first high frequency electric field), whereby more uniform plasma with higher density can be produced, resulting in improving both film forming rate and film quality. The power supplied to the first electrode is preferably not less than 5 W/cm$^2$. The upper limit of the power supplied to the first electrode is preferably 50 W/cm$^2$.

Herein, the waveform of the high frequency electric field is not specifically limited. There are a continuous oscillation mode which is called a continuous mode with a continuous sine wave and a discontinuous oscillation mode which is called a pulse mode carrying out ON/OFF discontinuously, and either may be used, however, a method supplying a continuous sine wave at least to the second electrode side (the second high frequency electric field) is preferred to obtain a uniform film with high quality.

It is necessary that electrodes used in the atmospheric pressure plasma film forming method is structurally and functionally resistant to the use under severe conditions. Such electrodes are preferably those in which a dielectric is coated on a metal base material.

In the dielectric coated electrode used in the present invention, the dielectric and metal base material used in the present invention are preferably those in which their properties meet. For example, one embodiment of the dielectric coated electrodes is a combination of conductive metal base material and a dielectric in which the difference in linear thermal expansion coefficient between the conductive base material and the dielectric is not more than $10 \times 10^{-6}/°$ C. The difference in linear thermal expansion coefficient between the conductive metal base material and the dielectric is preferably not more than $8 \times 10^{-6}/°$ C., more preferably not more than $5 \times 10^{-6}/°$ C., and most preferably not more than $2 \times 10^{-6}/°$ C. Herein, the linear thermal expansion coefficient is a known physical value specific to materials.

Combinations of conductive base material and dielectric having a difference in linear thermal expansion coefficient between them falling within the range as described above will be listed below.

1. A combination of pure titanium or titanium alloy as conductive metal base material and a thermal spray ceramic layer as a dielectric layer
2: A combination of pure titanium or titanium alloy as conductive metal base material and a glass lining layer as a dielectric layer
3: A combination of stainless steel as conductive metal base material and a thermal spray ceramic layer as a dielectric layer
4: A combination of stainless steel as conductive metal base material and a glass lining layer as a dielectric layer
5: A combination of a composite of ceramic and iron as conductive metal base material and a thermal spray ceramic layer as a dielectric layer
6: A combination of a composite of ceramic and iron as conductive metal base material and a glass lining layer as a dielectric layer
7: A combination of a composite of ceramic and aluminum as conductive metal base material and a thermal spray ceramic layer as a dielectric layer
8: A combination of a composite of ceramic and aluminum as conductive metal base material and a glass lining layer as a dielectric layer.

In the viewpoint of the difference in the linear thermal expansion coefficient, preferable are above 1, 2, and 5-8, but specifically preferable is 1.

In the present invention, as a metal base metal material, titanium is useful with respect to the above-mentioned property. By using titanium or a titanium alloy as the metal base material and by using the above dielectric, the electrode can be used under a severe condition for a long time without deterioration of the electrode, specifically, a crack, peeling or elimination.

As an atmospheric pressure plasma discharge apparatus employable in to the present invention, for example, those disclosed in JP-A Nos. 2004-68143 and 2003-49272 and WO02/48428 are included, together with described above.

EXAMPLES

Example 1

The present invention is concretely described in detail referring examples but the present invention is not limited thereto.

<<Preparation of Gas Barrier Laminate>>
Preparation of Gas Barrier Laminate Resin Material 1

On a substrate of poly(ethylene naphthalate) film of 100 μm, manufactured by Teijin-du Pont Co., Ltd., hereinafter referred to as PEN, two of gas barrier layers and three polymer layers are alternatively piled by the following atmospheric pressure plasma discharge apparatus and discharging conditions to prepare a gas barrier laminate 1. Such the layer constitution is shown in FIG. 1.

(Atmospheric Pressure Plasma Discharge Apparatus)

A roller electrode covered with a dielectric material and a set of plural square pillar-shaped electrodes were prepared as follows using the atmospheric pressure plasma discharge apparatus shown in FIG. 3.

The roller electrode to be used as the first electrode was prepared as follows: A jacket formed roll metal base material made from titanium alloy T64 having a cooling means using cooling water was covered by an alumina thermal sprayed layer with high density and strongly contacted with to the metal alloy by an atmospheric pressure plasma method. The diameter of the roller was made to 1,000 mm. On the other hand, a hollow square pillar-shaped titanium alloy T64 was covered by the above dielectric material under the same conditions to prepare a group of square pillar-shaped electrodes for the second electrode.

Twenty five of the square pillar-shaped electrodes were arranged around the rotatable roller electrode so that the space between the facing electrodes was made to 1 mm. The entire discharging area of the square pillar-shaped electrode group was 150 cm (length in the width direction)×4 cm (length in the conveying direction)×25 (number of the electrode)=15,000 cm². Suitable filters were provided to the electrodes.

The temperature of the first electrode (rotatable roller electrode) and the second electrode (square pillar-shaped fixed electrode group) was held at 80° C. during the plasma discharge and the rotatable roller electrode was rotated by a driving means to form the thin layer.

(1$^{st}$ Layer: Formation of Polymer Layer P-1 by Atmospheric Pressure Plasma CVD Method)

A polymer layer P-1 of 200 nm was formed by plasma discharging method under the following conditions.

<Condition of Gas>

| | |
|---|---|
| Discharging gas: Helium | 98.9% by volume |
| Thin layer formation gas: Tetraethoxysilane (hereinafter referred to as TEOS) vaporized with argon gas by a vaporizing apparatus manufacture by Rintech Co., Ltd., | 0.1% by volume |
| Additive gas: Hydrogen gas | 1% by volume |

(Polymer Layer Forming Condition: Power Source of the Second Electrode Side was Only Used.)

Second Electrode Side
Kind of power source: B3
Frequency: 13.56 MH
  Output density: The outputting condition on the occasion of gas supplying was suitably controlled within the range of from 1.5 W/cm² to 3.5 W/cm².

(2$^{nd}$ Layer: Formation of Gas Barrier Layer G-1: Atmospheric Pressure Plasma CVD Method)

A gas barrier layer G-1 of 60 nm was formed by plasma discharge under the following conditions.

<Gas Condition>

| | |
|---|---|
| Discharging gas: Nitrogen | 98.9% by volume |
| Thin layer forming gas: Tetraethoxysilane vaporized with argon gas by a vaporizing apparatus manufactured by Rintech Co., Ltd. | 0.1% by volume |
| Additive gas: oxygen gas | 1% by volume |

<Gas Barrier Layer Forming Conditions>
First Electrode Side
Kind of power source: A5
Electric field strength: 8 kV/mm
Frequency: 100 kHz
Output density: 1 W/cm$^{-1}$
Second Electrode Side
Kind of power source: B3
Electric field strength: 0.8 kV/mm
Frequency: 13.56 MHz
Output density: 3 W/cm²

(3$^{rd}$ Layer: Formation of Polymer Layer P-2 by Atmospheric Pressure Plasma CVD Method)

A polymer layer P-2 of 200 nm was formed by plasma discharge under the following conditions.

<Condition of Gas>

| | |
|---|---|
| Discharging gas: Argon | 98.9% by volume |
| Thin layer formation gas: Tetraethoxysilane (TEOS) vaporized with argon gas by a vaporizing apparatus manufacture by Rintech Co., Ltd., | 0.1% by volume |
| Additive gas: Hydrogen gas | 1% by volume |

Polymer layer forming condition: Power source of the second electrode side was only used.
Second Electrode Side
Kind of power source: B3
Frequency: 13.56 MH
  Output density: The outputting condition on the occasion of gas supplying was suitably controlled within the range of from 2 W/cm² to 4 W/cm².

(4$^{th}$ Layer: Formation of Gas Barrier Layer G-2: Atmospheric Pressure Plasma CVD Method)

Gas barrier layer G-2 of 60 nm was formed in the same manner as in the above 2$^{nd}$ layer (gas barrier layer G-1).

(5$^{th}$ Layer: Formation of Polymer Layer P-3 by Atmospheric Pressure Plasma CVD Method)

A polymer layer P-3 of 200 nm was formed in the same manner as in the above 2$^{nd}$ layer (polymer layer P-2)

[Preparation of Gas Barrier Laminates 2 to 4]

Gas barrier laminates 2 to 4 were prepared by the atmospheric pressure plasma CVD method in the same manner as in the above gas barrier laminate 1 except that the substrate and the kind of the thin layer forming gas for forming each of the gas barrier layers and the polymer layers were changed as described in Table 1 and the partial pressure of tetramethylsilane was continuously varied while holding the whole pressure at 10 Pa by continuously supplying nitrogen and the supplying amount of the thin layer forming gas was suitably controlled so that the average carbon content in each of the polymer layer was made to the condition described in Table 2.

The conditions for forming each of the polymer layers were as follows.

<Condition of Gas>
Discharging gas: Nitrogen Amount necessary for making the total amount of gas to 100% by volume
Thin layer forming gas: The supplying amount of the raw material was suitably varied so as to obtain the condition described in Table 2. The raw material was vaporized with nitrogen gas by the vaporizing apparatus manufactured by Rintech Co., Ltd.
 In concrete, the concentration of the raw material was changed as follows along the depositing direction.
Sample 2 P-1; 0.3→0.1 percent by volume
 P-2; 0.05→0.25→0.05 percent by volume
Sample 3 P-1; 0.5→0.12 percent by volume
 P-2: 0.12→0.5→0.13 percent by volume
Sample 4 P-1: 0.35→0.05 percent by volume
 P-2: 0.1→0.35→0.1 percent by volume
Additive gas: Hydrogen gas
<Polymer Layer Forming Conditions>
First Electrode Side
Kind of power source: A5
Electric field strength: 8 kV/mm
Frequency: 100 kHz
Output density: 1 W/cm$^2$
Second Electrode Side
Kind of power source: B3
Electric field strength: 0.8 kV/mm
Frequency: 13.56 MHz
Output density: 3 W/cm$^2$ Preparation of Gas Barrier Laminate 5 by Vacuum Plasma Method Gas barrier laminate 5 having the same layer constitution as the gas barrier laminate 1 was prepared by a vacuum plasma method.

(1$^{st}$ Layer: Formation of Polymer Layer P-1)

Poly(ethylene terephthalate) film having a clear coat layer of 125 μm, manufactured by Rintech Co., Ltd., hereinafter referred to as PET, was set in the vacuum chamber of a vacuum deposition apparatus. After deaeration by 10$^{-4}$ Pa, a polymer layer P-1 of 200 nm was formed by using tetraethoxysilane (TEOS), hydrogen gas and helium gas under conditions of a applying voltage (RF power) of 100 W and a substrate temperature of 180° C. while suitably controlling the supplying amount of the raw material so as to make the average carbon content to that described in Table 2.

(2$^{nd}$ Layer: Formation of Gas Barrier Layer C-1)

The above prepared sample composed of the substrate and the polymer layer P-1 provided thereon was set in the vacuum chamber of the vacuum deposition apparatus. After evaporation by 10$^{-4}$ Pa, a gas barrier layer of 60 nm was formed by using hexamethyldisiloxane, hereinafter referred to as HMDSO, hydrogen gas and helium gas under conditions of an applying voltage (RF power) of 300 W and a substrate temperature of 180° C.

(3$^{rd}$ Layer: Formation of Polymer Layer P-2)

The above prepared sample having the polymer layer P-1 and the gas barrier layer G-1 was set in the vacuum chamber of the vacuum deposition apparatus. After evaporation by 10$^{-4}$ Pa, a polymer layer P-2 of 200 nm was formed by using tetraethoxysilane (TEOS) as the thin layer forming gas and hydrogen gas as the discharging gas under conditions of an applying voltage (RF power) of 100 W and a substrate temperature of 180° C. while controlling the supplying amount of the raw material so as to make the average carbon content to that described in Table 2.

(4$^{th}$ Layer: Formation of Gas Barrier Layer G-2)

A gas barrier layer G-2 was formed on the polymer layer P-2 of the above sample in the same manner as in the above gas barrier layer G-1.

(5$^{th}$ Layer: Formation of Polymer Layer P-3)

Polymer layer P-3 was formed on gas barrier layer G-2 of the above prepared sample in the same manner as in the above polymer layer P-2.

Preparation of Gas Barrier Laminate 6

A gas barrier material 6 having the same layer constitution of the gas barrier laminate 1 was prepared using 100 μm polycarbonate film, manufactured by Teijin Kasei Co., Ltd., hereinafter referred to as PC, by the following method.

(1$^{st}$ Layer: Formation of Polymer Layer P-1 by Vacuum Evaporation Method)

In the vacuum chamber of the vacuum deposition apparatus, Si target was charged into a vapor source as raw material 1 and then the interior of the chamber was deaerated by 10$^{-4}$ Pa. After that, heating the vapor source was started. After completion of vaporization of impurities, the vacuum evaporation shutter was open while supplying 1,10-decanediol acrylate for depositing a polymer layer of 200 nm while suitably controlling the supplying amount of 1,10-decanediol acrylate so as to make the average carbon content to that described in Table 2. Then the sample was irradiated by an integrated amount of 500 mJ/cm$^2$ of UV rays.

(2$^{nd}$ Layer: Formation of Gas Barrier Layer G-1 by Electron Ray Vacuum Evaporation Method)

In the vacuum chamber of the vacuum deposition apparatus, Si target was charged as a vapor source and the above sample composed of the substrate and the polymer layer P-1 provided thereon was set, and then the interior of the chamber was evaporated by 10$^{-4}$ Pa and a barrier layer of 60 nm was formed by an electron ray vacuum evaporation method.

(3$^{rd}$ Layer: Formation of Polymer Layer P-2)

A polymer layer P-2 of 200 nm was deposited on the gas barrier G-1 of the above sample under the conditions the same as those for forming the above polymer layer P-1 while the supplying amount of 1,10-decanediol acrylate so as to make the average carbon content to that described in Table 2.

(4$^{th}$ Layer: Formation of Gas Barrier Layer G-2)

A gas barrier layer G-2 was formed on polymer layer P-2 of the above sample in the same manner as in the formation of the above gas barrier layer G-1.

(5$^{th}$ Layer: Formation of Polymer Layer P-3)

A polymer layer P-3 was formed on the gas barrier layer G-2 of the above sample in the same manner as in the formation of the above polymer layer P-2.

Preparation of Gas Barrier Laminate 7

A gas barrier laminate 7 having the same layer constitution as the above gas barrier laminate was prepared according to the following procedure using 100 μm poly(ethylene naphthalate) film (PEN).

(Formation of Polymer Layers P-1, P-2 and P-3 by Vacuum Plasma Method)

Polymer layers P-1, P-2 and P-3 were prepared by the vacuum plasma method in the same manner as in the polymers P-1, P-2 and P-3, respectively, except that the thin layer forming gas was changed to TEOS and methyl methacrylate and the output power was suitably control so as to make the average carbon content to that described in Table 2.

(Formation of Gas Barrier Layers G-1 and G-2 by Sputtering Method)

The designated sample was set in the vacuum chamber of a sputtering apparatus so that a layer is formed on the of polymer layer formed side and the interior of the chamber was evaporated by $10^{-4}$ Pa and the temperature in the chamber was adjusted to 150° C. After that, a partial pressure of 0.1 Pa of argon gas as the discharging gas and a partial pressure of 0.008 Pa of oxygen as the reactive gas were introduced in the vacuum chamber. After stabilization of the atmosphere and the temperature, discharging was started at a sputtering power of 2 W/cm² to generate plasma on the Si target for beginning the sputtering process. When the process was stabilized, the shutter was open for starting the formation of a gas barrier layer on the polymer layer. The layer formation was completed by closing the shutter after the layer of 60 nm was deposited.

(Preparation of Gas Barrier Laminate 8)

A gas barrier laminate 8 was prepared in the same manner as in the gas barrier laminate 1 except that the formation method of the each of the polymer layers were changed to the following vacuum plasma method.

(Formation of $1^{St}$, $3^{Rd}$ and $5^{Th}$ Polymer Layers by Vacuum plasma method)

Each of the polymer layers was formed in the same manner as in the vacuum plasma method used for forming the $1^{st}$ layer (polymer layer P-1) except that the thin layer forming gas was changed to HMDSO and the layer forming conditions from the start to the completion of the layer formation were constantly held.

Preparation of Gas Barrier Laminate 9

Gas barrier laminate 9 was prepared in the same manner as in the above gas barrier laminate 2 except that the method for forming the polymer layers was changed to the following coating method.

(Formation of $1^{st}$, $3^{rd}$ and $5^{th}$ Polymer Layers: Coating Method)

Tripropylene diacrylate and heaxamethylenedisiloxane were mixed so that the average carbon content becomes 72% ($1^{st}$ layer) or 71% ($3^{rd}$ and $5^{th}$ layers) and diluted by ethyl acetate to prepare a coating liquid. The coating liquid was coated on the gas barrier layer by a wire bar under conditions so that the dried thickness of the layer was made to 0.2 μm and dried for 10 minutes at 80° C. for removing ethyl acetate and then irradiated by UV rays in a integral amount of 500 J/cm².

(Preparation of Gas Barrier Laminate 10)

The polymer layers were each formed by vacuum evaporation method in the same manner as in the gas barrier laminate 6 except that the substrate was changed to polyester film having a thickness of 100 μm, Sumilight FS-1300 manufactured by Sumitomo Bakelite Co., Ltd., hereinafter referred to as PES, and the thin layer forming material was changed to neopentyl glycol-modified trimethylpropane diacrylate, Kayarad R-604 manufactured by Nihon Kayaku Co., Ltd., and the layer forming conditions from the start to the completion of the layer formation were constantly held.

The constitutions of each of the gas barrier laminates prepared as above are listed in Table 1.

Acronyms of the substrates, raw materials and thin layer forming materials in Table 1 are as follows.

<Substrate>
 PEN: poly(ethylene naphthalate) film, manufactured by Teijin-du Pont Co., Ltd.
 Copolymerized PC: Copolymerized polycarbonate film
 Zeonoa: Zeonoa Z1420R, manufactured by Nihon Zeon Co., Ltd.
 PES: Polyethersulfon film Sumilite FS-1300, manufactured by Sumitomo Bakelite Co., Ltd.
 PET: Poly(ethylene terephthalate) film with clear hard coat layer manufactured by Rintech Co., Ltd.
 PC: Polycarbonate film <Raw Material>
 TEOS: Tetraethoxysilane
 HMDSO: Hexamethyldisiloxane
 HMDSN: Hexamethyldisilazane
 Polymer 1: Tripropylene glycol diacrylate
 Polymer 2: Methyl methacrylate
 Polymer 3: Neopentyl glycol-modified trimethylpropane diacrylate
 *A: 1,10-decandiol acrylate <Layer Forming Method>
 AGP: Atmospheric pressure plasma CVD method

TABLE 1

| *3 | Substrate | Polymer layer (1st layer: P-1) | | *1 | Gas barrier layer (2nd and 4th layers) | | Polymer layer (3rd and 5th layers) | | *1 Remarks |
|---|---|---|---|---|---|---|---|---|---|
| | | Raw material | Layer forming method | | Raw material | Layer forming method | Raw material | Layer forming method | |
| 1 | PEN | TEOS | AGP | *4 | TEOS | AGP | TEOS | AGP | *4 Inv. |
| 2 | Copolymerized PC | HMDSO | AGP | *2 | HMDSO | AGP | HMDSO | AGP | *2 Inv. |
| 3 | Zeonea | HMDSO/Polymer 1 | AGP | *2 | HMDSN | AGP | HMDSO/Polymer 1 | AGP | *2 Inv. |
| 4 | PES | TEOS/polymer 2 | AGP | *2 | HMDSO | AGP | TEOS/Polymer 2 | AGP | *2 Inv. |
| 5 | PET | TEOS | Vacuum plasma | *2 | HMDSO | Vacuum plasma | TEOS | Vacuum plasma | *2 Inv. |
| 6 | PC | SiO target/*A | Vacuum evaporation | *2 | SiO | Electron ray vapor deposition | SiO target/*A | Vacuum evaporation | *2 Inv. |
| 7 | PEN | TEOS/Polymer 2 | Vacuum plasma | *2 | SiO | Sputtering | TEOS/Polymer 2 | Vacuum plasma | *2 Inv. |
| 8 | PEN | HMDSO | Vacuum plasma | — | TEOS | AGP | HMDSO | Vacuum plasma | — Comp. |

TABLE 1-continued

| *3 | Substrate | Polymer layer (1st layer: P-1) | | Gas barrier layer (2nd and 4th layers) | | Polymer layer (3rd and 5th layers) | | *1 | Remarks |
|---|---|---|---|---|---|---|---|---|---|
| | | Raw material | Layer forming method | *1 | Raw material | Layer forming method | Raw material | Layer forming method | |
| 9 | Copolymerized PC | HMDSO/ Polymer 1 | Coating | — | HMDSO | AGP | HMDSO/ Polymer 1 | Coating | — | Comp. |
| 10 | PES | Polymer 3 | Vacuum evaporation | — | SiO | Electron ray vapor deposition | Polymer 3 | Vacuum evaporation | — | Comp. |

*1: Average carbon content controlling method, Inv.: Inventive, Comp.: Comparative
*2: Raw material supplying amount,
*3: Gas barrier resin material No.
*4: Output condition <<Measurement of Average Carbon Content in the Polymer Layer of the Gas Barrier Laminate>>

The average carbon content in each of the polymer layer 20 having a thickness of 200 nm of the above prepared gas barrier laminates was measured by the foregoing method using a XPS surface analyzer ESCALAB-200R manufactured by VG Scientific Co., Ltd. The measurement was carried out for ten areas of every thickness of 20 nm from the bottom (Area 1) to the outermost area. The obtained results are shown in table 2.

The average carbon content in the whole area of the polymer layer was also measured by the above XPS method. The obtained results are listed in the same table.

<<Evaluation of Gas Barrier Laminates>>
Evaluation 1: Evaluation of Untreated Sample The above obtained gas barrier laminates were subjected to the following evaluations.

(Measurement of Steam Permeability)
The steam permeability was measured by the method described in JIS K 7129B.

(Measurement of Oxygen Permeability)
The oxygen permeability was measured by the method described in JIS K 7126B.

(Evaluation of Adhesiveness of Layer)
Grid test according to JIS K 5400 was carried out. Eleven cut lines at 1 mm space were each made lengthwise and

TABLE 2

| Gas barrier resin material No. | 1st layer: Average carbon content in polymer layer P-1 Measurement area | | | | | | | | | | | |
|---|---|---|---|---|---|---|---|---|---|---|---|---|
| | Area 1 | Area 2 | Area 3 | Area 4 | Area 5 | Area 6 | Area 7 | Area 8 | Area 9 | Area 10 | Whole area | Remarks |
| 1 | 38.8 | 33.5 | 30.8 | 28.1 | 25.5 | 22.8 | 20.1 | 17.4 | 14.8 | 12.1 | 24.4 | Inventive |
| 2 | 36.6 | 28.0 | 24.5 | 21.4 | 18.8 | 16.6 | 14.9 | 13.8 | 13.0 | 12.8 | 20.0 | Inventive |
| 3 | 62.4 | 57.7 | 54.9 | 52.0 | 48.9 | 45.4 | 41.5 | 36.9 | 30.8 | 16.2 | 44.6 | Inventive |
| 4 | 44.4 | 38.3 | 35.1 | 31.8 | 28.4 | 24.9 | 21.2 | 17.2 | 12.8 | 6.8 | 26.1 | Inventive |
| 5 | 37.9 | 30.2 | 26.5 | 23.0 | 19.5 | 16.2 | 13.0 | 10.0 | 7.4 | 5.3 | 18.9 | Inventive |
| 6 | 35.4 | 30.7 | 28.3 | 25.7 | 23.1 | 20.4 | 17.6 | 14.5 | 11.2 | 6.6 | 21.4 | Inventive |
| 7 | 21.5 | 20.0 | 19.3 | 18.5 | 17.6 | 16.7 | 15.7 | 14.6 | 13.2 | 11.0 | 16.8 | Inventive |
| 8 | 20.7 | 21.2 | 21.3 | 21.2 | 21.2 | 21.3 | 21.1 | 21.2 | 21.2 | 22.6 | 20.2 | Comparative |
| 9 | 72.2 | 72.9 | 72.1 | 73.0 | 73.2 | 73.2 | 73.0 | 73.0 | 72.9 | 72.7 | 72.0 | Comparative |
| 10 | 74.1 | 74.9 | 74.9 | 74.8 | 74.7 | 74.8 | 74.8 | 74.6 | 74.8 | 74.9 | 73.8 | Comparative |

| Gas barrier resin material No. | 3rd and 5th layer: Average carbon content in polymer layer P-2 and Layer P-3 Measurement area | | | | | | | | | | | |
|---|---|---|---|---|---|---|---|---|---|---|---|---|
| | Area 1 | Area 2 | Area 3 | Area 4 | Area 5 | Area 6 | Area 7 | Area 8 | Area 9 | Area 10 | Whole area | Remarks |
| 1 | 8.7 | 13.6 | 16.1 | 18.6 | 21.0 | 23.5 | 19.7 | 16.1 | 12.4 | 8.8 | 15.8 | Inventive |
| 2 | 6.8 | 9.4 | 12.8 | 17.4 | 23.3 | 30.6 | 20.0 | 12.7 | 8.3 | 7.2 | 14.8 | Inventive |
| 3 | 16.2 | 25.3 | 31.8 | 40.0 | 49.9 | 61.2 | 46.3 | 32.6 | 23.0 | 18.7 | 34.5 | Inventive |
| 4 | 12.1 | 33.8 | 33.7 | 42.8 | 46.4 | 49.7 | 43.2 | 36.4 | 28.2 | 12.8 | 34.4 | Inventive |
| 5 | 5.5 | 11.4 | 13.3 | 15.1 | 16.7 | 18.2 | 16.0 | 13.4 | 10.4 | 5.7 | 12.5 | Inventive |
| 6 | 5.8 | 10.7 | 12.4 | 14.0 | 15.5 | 16.9 | 14.7 | 12.4 | 9.7 | 5.8 | 11.8 | Inventive |
| 7 | 10.8 | 15.7 | 18.2 | 20.7 | 23.1 | 25.6 | 21.8 | 18.1 | 14.5 | 11.0 | 17.9 | Inventive |
| 8 | 21.2 | 20.2 | 20.1 | 20.0 | 19.8 | 19.7 | 20.1 | 20.2 | 20.0 | 20.0 | 20.0 | Comparative |
| 9 | 71.5 | 70.7 | 70.1 | 69.8 | 70.4 | 71.3 | 71.2 | 71.0 | 70.4 | 70.4 | 70.8 | Comparative |
| 10 | 73.8 | 72.8 | 72.8 | 72.8 | 73.0 | 73.0 | 73.0 | 73.0 | 73.0 | 73.0 | 72.9 | Comparative | crosswise to cross at a right angle on the surface of the thin layer so that a hundred patterns of 1 mm square were formed. Cellophane tape was pasted on thus formed pattern and peeled off by hand in the vertical direction and the ratio of the peeled area of the thin layer to the area of the tape pasted on the cut line patterns. The evaluation was performed according to the following norms.

A: Peeling was not observed at all.
B: The ratio of peeled area was from 0.1% to less than 5%.
C: The ratio of peeled area was from 5% to less than 10%.
D: The ratio of peeled area was not less than 10%.

Evaluation 2: Evaluation of Sample after Bending

Each of the above prepared gas barrier laminates was wound on a metal rod having a diameter of 300 mm so that the thin layer formed surface was faced to out side and then released after 5 minutes. After repeating such the operation for 10 times, the steam permeability, oxygen permeability and adhesiveness of the layer were evaluated.

Evaluation 3: Evaluation of Storing Ability A

Each of the above prepared gas barrier laminates was stored for 1,000 hours under conditions of 80° C. and 90% RH and then the steam permeability and oxygen permeability and adhesiveness of layer were measured by the same method as in Evaluation 1.

Evaluation 4: Evaluation of Storing Ability B

Each of the above prepared gas barrier laminates was stored for 1,000 hours under conditions of 90° C. and 0% RH and then the steam permeability and oxygen permeability and adhesiveness of layer were measured by the same method as in Evaluation 1.

Thus obtained results are listed in Table 3.

used as the base plate of the organic EL display and a transparent electrode constituting the anode, a positive hole transportation layer having positive hole transporting ability, a light emission layer, an electron injection layer and a backing electrode as the cathode were piled on the gas barrier laminates. Thus prepared piled layer was sealed by a glass can pasted by an epoxy type sealing agent, epoxy adhesive 3124C manufactured by Three Bond Co., Ltd., to prepare the organic EL display panel. In the glass can a drying agent manufactured by Japan Goatex Co., Ltd., was inserted. The displaying panel was stored for 1,000 hours at 50° C. and 90% RH and photographed with a magnitude of 50 for evaluating the occurrence of dark spots. As a result of that, any dark spot was not observed on the samples of the present invention. In contrast, many dark spots were observed on the comparative samples. It is understood that the gas barrier laminate according to the present invention has excellent steam insulating effect and oxygen insulating effect.

(Probability of Industrial Application)

The gas barrier laminate which has high gas barrier ability and is improved in the adhesiveness among the substrate, polymer layer and the gas barrier layer and excellent in the anti-bending property and the weather resistivity and the production thereof can be realized according to the present invention.

What is claimed is:

1. A gas barrier laminate comprising a substrate having thereon at least a gas barrier layer and a polymer layer, the laminate being an organic EL element base plate,

TABLE 3

| Gas barrier resin material No. | Evaluation 1: Untreated sample | | | Evaluation 2: Sample after bending rest | | | Evaluation 3: Storing ability test A | | | Evaluation 4: Storing ability test B | | | Remarks |
|---|---|---|---|---|---|---|---|---|---|---|---|---|---|
| | *A | *B | *1 | *A | *B | *1 | *A | *B | *1 | *A | *B | *1 | |
| 1 | <0.1 | <0.1 | A | <0.1 | <0.1 | A | <0.1 | <0.1 | A | <0.1 | <0.1 | A | Inventive |
| 2 | <0.1 | <0.1 | A | <0.1 | <0.1 | A | <0.1 | <0.1 | A | <0.1 | <0.1 | A | Inventive |
| 3 | <0.1 | <0.1 | A | <0.1 | <0.1 | A | <0.1 | <0.1 | A | <0.1 | <0.1 | A | Inventive |
| 4 | <0.1 | <0.1 | A | <0.1 | <0.1 | A | <0.1 | <0.1 | A | <0.1 | <0.1 | A | Inventive |
| 5 | <0.1 | <0.1 | B | <0.1 | <0.1 | B | <0.1 | <0.1 | B | <0.1 | <0.1 | B | Inventive |
| 6 | <0.1 | <0.1 | B | <0.1 | <0.1 | B | <0.1 | <0.1 | B | <0.1 | <0.1 | B | Inventive |
| 7 | <0.1 | <0.1 | B | <0.1 | <0.1 | B | <0.1 | <0.1 | C | <0.1 | <0.1 | B | Inventive |
| 8 | <0.1 | <0.1 | B | 1.2 | 0.8 | C | <0.1 | 0.27 | D | 1.2 | 0.95 | D | Comparative |
| 9 | <0.1 | <0.1 | B | <0.1 | <0.1 | B | <0.1 | <0.1 | D | <0.1 | <0.1 | D | Comparative |
| 10 | <0.1 | <0.1 | C | <0.1 | <0.1 | C | 0.33 | 0.43 | D | 0.52 | 0.49 | D | Comparative |

*A: Moisture permeability(g/m$^2$/day),
*B: Oxygen permeability(ml/m$^2$ · 24 h · 1 atm)
*1: Adhesiveness As is cleared by the results in Table 3, the multilayered bas barrier materials of the present invention in which the polymer layers and the gas barrier layer are piled and the average carbon content has the profile specified by the present invention maintain superior steam insulation ability, oxygen insulation ability and adhesiveness of the layer after the bending treatment or storage for long time compared with the comparative samples. It is understood that the multilayer gas barrier materials in which the polymer layers and the gas barrier layers are each formed by the atmospheric pressure gas plasma CVD method are particular superior among them.

Example 2

Organic EL display panels were prepared in each of which the gas barrier laminates prepared in Example 1 respectively wherein at leas t one polymer layer is provided on the substrate and at least one gas barrier layer is provided on the polymer layer, wherein an average carbon content of the polymer layer at a contact interface between the substrate and the polymer layer is higher than an average carbon content in the polymer layer other than the contact interface between the substrate and the polymer layer;

an average carbon content of the polymer layer at a contact interface between the polymer layer and the gas barrier layer is lower than an average carbon content in the polymer layer, wherein the average carbon content is an average atomic concentration in percent of carbon atoms defined by the following equation:

atomic concentration=Number of carbon atoms/Number of whole atoms×100;

the contact interface between the polymer layer and the substrate or the contact interface between polymer layer and gas barrier layer is 10% of a thickness of the polymer layer from the contact interface when the thickness of the polymer layer is set at 100%; and a difference between an average atomic concentration of carbon atoms of the polymer layer and an average atomic concentration of carbon atoms at the contact interface between the polymer layer and the substrate or the contact interface between the polymer layer and the gas barrier layer is not less than 2%;

the gas barrier layer comprises a metal; and the polymer layer comprises a metal.

2. The gas barrier laminate of claim 1, wherein the gas barrier layer and the polymer layer are alternatively laminated.

3. The gas barrier laminate of claim 1, wherein a carbon content in the polymer layer provided adjacent to the q as barrier layer continuously increases along a thickness direction from the interface between the polymer layer and the gas barrier layer to the interface between the polymer layer and the substrate.

4. The gas barrier laminate of Claim l, wherein the difference between the average atomic concentration of carbon atoms in the polymer layer and the average atomic concentration wf carbon atoms at the contact interface between the polymer layer and the substrate or the contact interface between the polymer layer and the gas barrier layer is not less than 6%.

5. A method of producing the gas barrier laminate of claim 1 comprising the steps of:

forming a polymer layer; and forming a gas barrier layer, on the substrate, wherein at least one polymer layer is formed by a plasma CVD method.

6. The method of claim 5, wherein the plasma CVD method is carried out under an atmospheric pressure or a near atmospheric pressure.

7. A method of producing the gas barrier laminate of claim 1 comprising the steps of:

forming a polymer layer; and forming a gas barrier layer, on the substrate, wherein all the polymer layer is formed by a plasma CVD method.

8. The method of claim 7, wherein the plasma CVD method is carried out under an atmospheric pressure or a near atmospheric pressure.

* * * * *